United States Patent
Wuu et al.

(10) Patent No.: US 9,331,250 B1
(45) Date of Patent: May 3, 2016

(54) LIGHT EMITTING DEVICE WITH ANTI-TOTAL-INTERNAL-REFLECTION CAPABILITY

(71) Applicant: National Chung-Hsing University, Taichung (TW)

(72) Inventors: Dong-Sing Wuu, Taichung (TW); Shih-Hao Chuang, Taichung (TW); Ray-Hua Horng, Taichung (TW)

(73) Assignee: NATIONAL CHUNG-HSING UNIVERSITY, Taichung (TW)

( * ) Notice: Subject to any disclaimer, the term of this patent is extended or adjusted under 35 U.S.C. 154(b) by 0 days.

(21) Appl. No.: 14/602,236

(22) Filed: Jan. 21, 2015

(30) Foreign Application Priority Data

Oct. 24, 2014 (TW) .............................. 103136799 A (51) Int. Cl.
| | |
|---|---|
| *H01L 33/44* | (2010.01) |
| *H01L 33/32* | (2010.01) |
| *H01L 33/42* | (2010.01) |
| *H01L 33/00* | (2010.01) |

(52) U.S. Cl.
CPC ............. *H01L 33/44* (2013.01); *H01L 33/0075* (2013.01); *H01L 33/32* (2013.01); *H01L 33/42* (2013.01); *H01L 2933/0016* (2013.01); *H01L 2933/0025* (2013.01)

(58) Field of Classification Search
CPC .. H01L 51/5298; H01L 27/3295; H01L 33/60
USPC ................................................ 257/76; 438/29
See application file for complete search history.

(56) References Cited

U.S. PATENT DOCUMENTS

| | | | |
|---|---|---|---|
| 2003/0224162 | A1 | 12/2003 | Hirai et al. |
| 2005/0139825 | A1* | 6/2005 | Song et al. ....................... 257/44 |
| 2006/0073692 | A1 | 4/2006 | Yoshida et al. |
| 2014/0167085 | A1 | 6/2014 | Lee et al. |
| 2015/0099321 | A1* | 4/2015 | Tsung et al. ..................... 438/29 |

* cited by examiner

*Primary Examiner* — Cuong Q Nguyen
*Assistant Examiner* — Tong-Ho Kim
(74) *Attorney, Agent, or Firm* — DLA Piper LLP (US)

(57) ABSTRACT

A light emitting device includes: a light emitting layered structure; an electrode unit connected to the light emitting layered structure and including a transparent electrode layer of a primary metal oxide which is stacked on the light emitting layered structure along a stacking direction; and a total-internal-reflection suppression material dispersed in the transparent electrode layer and containing a secondary metal oxide that is different from the primary metal oxide. The secondary metal oxide has a concentration gradient within the transparent electrode layer along the stacking direction. The light output power of the light emitting device may be increased by about 44% as compared to a conventional light emitting device.

16 Claims, 11 Drawing Sheets

LIGHT EMITTING DEVICE WITH ANTI-TOTAL-INTERNAL-REFLECTION CAPABILITY

CROSS-REFERENCE TO RELATED APPLICATION

This application claims priority of Taiwanese Patent Application No. 103136799, filed on Oct. 24, 2014, the entire disclosure of which is hereby incorporated by reference.

FIELD OF THE INVENTION

This invention relates to a light emitting device with anti-total-internal-reflection (ATIF) capability, more particularly to a light emitting device including a total-internal-reflection suppression material dispersed in a transparent electrode layer.

DESCRIPTION OF THE RELATED ART

Figure 1:
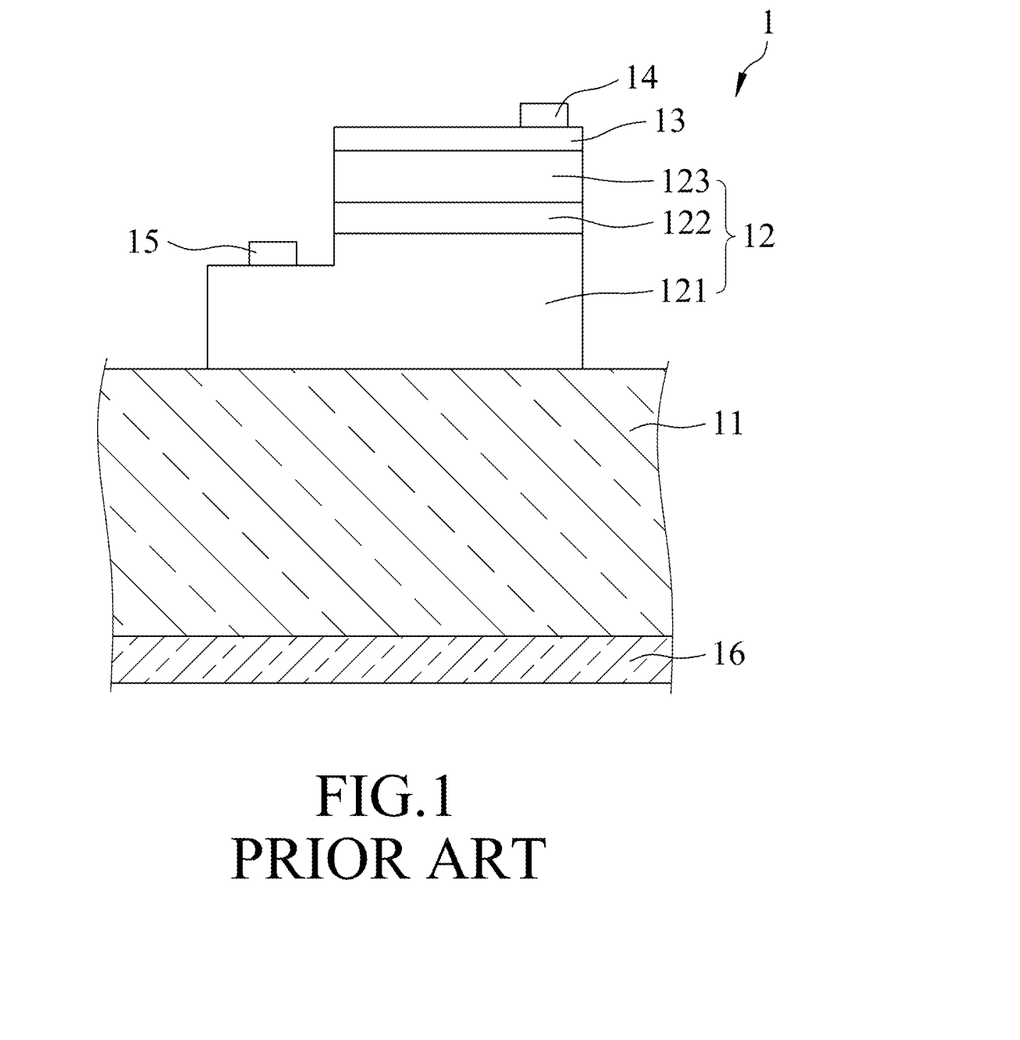
FIG. 1 is a schematic view of a conventional light emitting device.

FIG. 1 illustrates a conventional light emitting device 1 that includes a sapphire substrate 11, a light emitting layered structure 12, a transparent electrode layer 13, a first electrode contact 14, a second electrode contact 15, and a reflective layer 16. The light emitting layered structure 12 includes a n-GaN layer 121, an active layer 122 and a p-GaN layer 123. The transparent electrode layer 13 may be made of indium tin oxide (ITO), and serves to permit uniform spread of an electric current in the light emitting layered structure 12. However, the combination of the transparent electrode layer 13 and the p-GaN layer 123 results in generation of undesired total internal reflection at an interface therebetween, which results in a decrease in the light emitting efficiency. In addition, total internal reflection may also occur within the transparent electrode layer 13, which further decreases the light emitting efficiency.

U.S. Patent Application Publication No. 2014/0167085 discloses a light emitting device that includes a transparent substrate, a transparent electrode formed on the substrate, a light extraction layer formed on the transparent electrode, a light emitting layer formed on the light extraction layer and areas of the transparent electrode which are exposed from the light extraction layer, and a reflective electrode formed on the light emitting layer. The substrate may be formed of glass or plastic materials. The transparent electrode may be formed of a transparent metal oxide, such as indium tin oxide or indium zinc oxide. The light extraction layer serves to emit a light from the light emitting layer to the outside through the substrate, and may be made from a material having a similar refractive index to that of the substrate or a material having a refractive index greater than that of the light emitting layer. For example, the light extraction layer may be formed of $SiO_2$, $TiO_2$, or a photoresist, and may include a plurality of scatters distributed in a transparent medium.

Since a significant portion of the light emitting layer is covered by the light extraction layer, the contact area between the light emitting layer and the transparent electrode is considerably reduced, which may result in a poor spreading of the electric current in the light emitting layer. In addition, the inclusion of the light extraction layer increases an overall layer thickness of the light emitting device.

SUMMARY OF THE INVENTION

Therefore, an object of the present invention is to provide a light emitting device that can overcome at least one of the aforesaid drawbacks associated with the prior art.

According to one aspect of this invention, there is provided a light emitting device with anti-total-internal-reflection capability. The light emitting device includes: a light emitting layered structure; an electrode unit connected to the light emitting layered structure for providing electrical power to the light emitting layered structure, the electrode unit including a transparent electrode layer of a primary metal oxide which is stacked on the light emitting layered structure along a stacking direction; and a total-internal-reflection suppression material dispersed in the transparent electrode layer and containing a secondary metal oxide that is different from the primary metal oxide. The secondary metal oxide has a concentration gradient within the transparent electrode layer along the stacking direction.

According to another aspect of this invention, there is provided a method of making a light emitting device. The method includes: preparing a light emitting layered structure; forming a particle layer, which contains metal nanoparticles of a first metal, on the light emitting layered structure; and simultaneously forming a transparent electrode layer of a primary metal oxide and at least partially oxidizing the first metal to form a secondary metal oxide, such that the secondary metal oxide is dispersed in the transparent electrode layer.

BRIEF DESCRIPTION OF THE DRAWINGS

In drawings which illustrate an embodiment of the invention.

DETAILED DESCRIPTION OF THE EMBODIMENT

Figure 2:
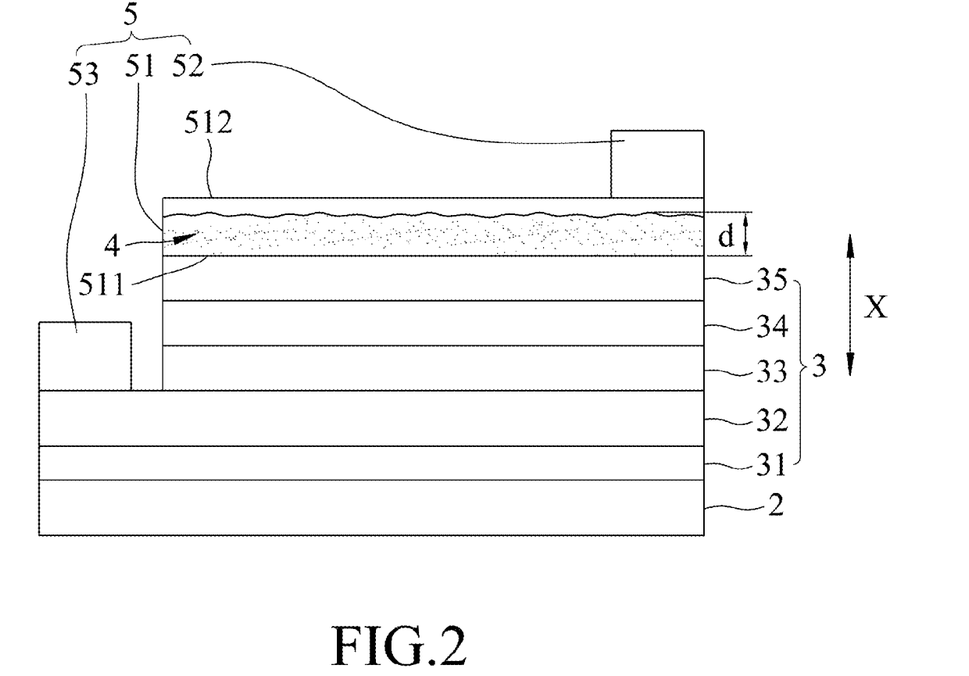
FIG. 2 is a schematic view of the embodiment of a light emitting device according to the present invention.
Figure 3:
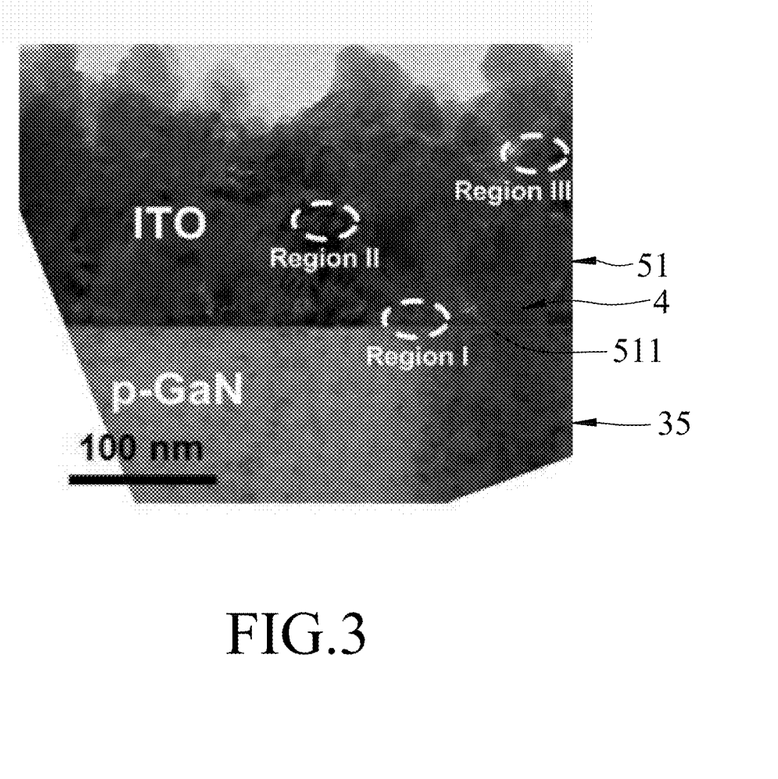
FIG. 3 is a High Resolution Transmission Electron Microscope (HR-TEM) image of an assembly of a second type semiconductor layer and a transparent electrode layer of the embodiment.
Figure 4:
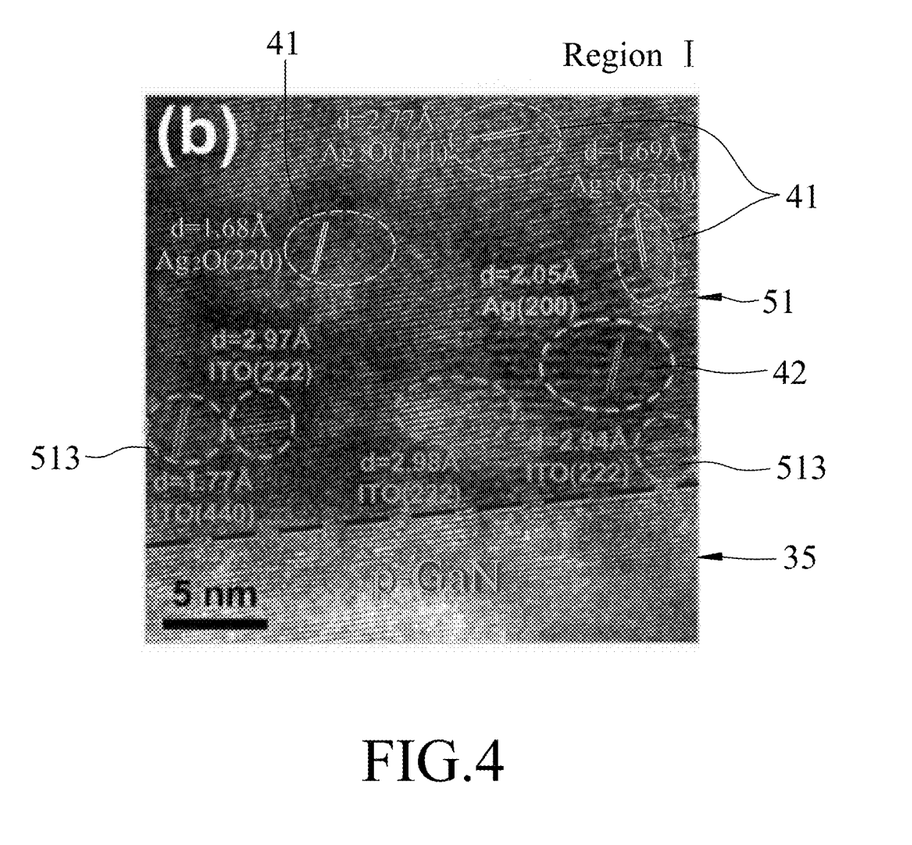
FIG. 4 is an amplified HR-TEM image of Region I shown in FIG. 3.
Figure 5:
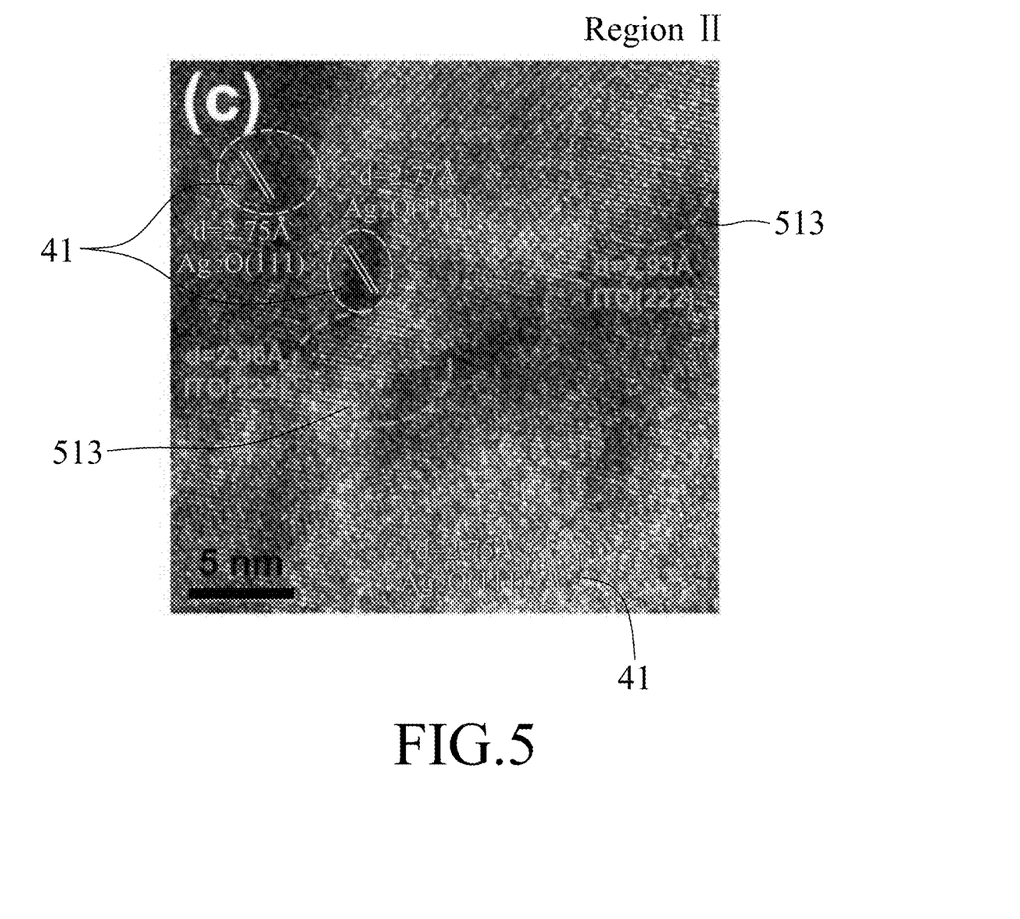
FIG. 5 is an amplified HR-TEM image of Region II shown in FIG. 3.
Figure 6:
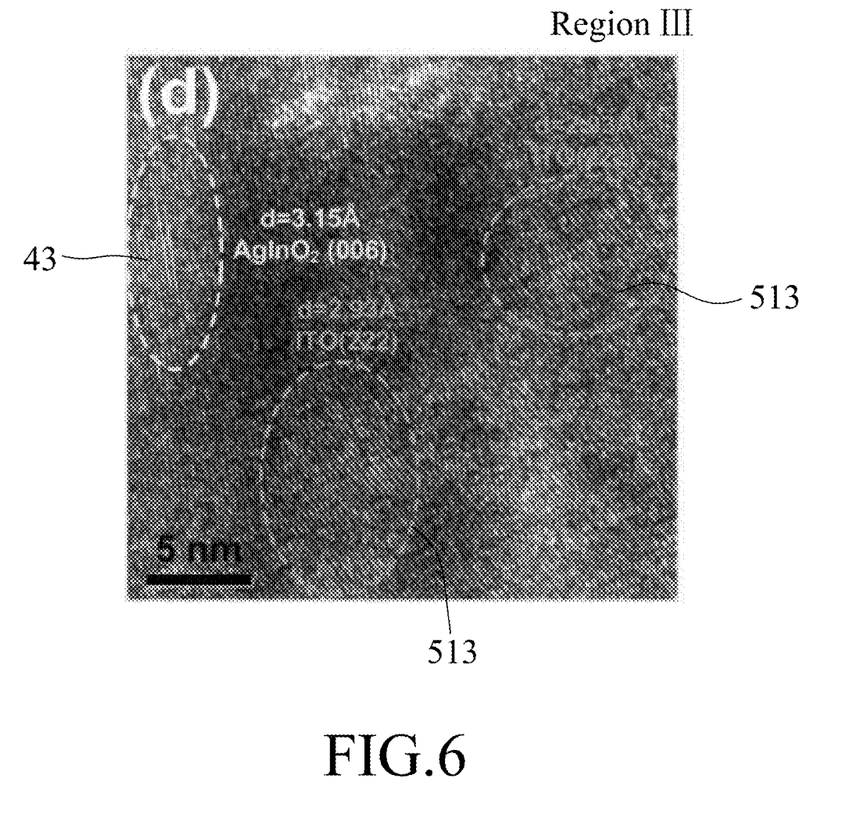
FIG. 6 is an amplified HR-TEM image of Region III shown in FIG. 3.

FIG. 2, in combination with FIGS. 3 to 6, illustrates the embodiment of a light emitting device with anti-total-internal-reflection (ATIF) capability according to the present invention.

The light emitting device includes: a substrate 2; a light emitting layered structure 3; an electrode unit 5 connected to the light emitting layered structure 3 for providing electrical power to the light emitting layered structure 3, the electrode unit 5 including a transparent electrode layer 51 of a primary metal oxide 513 (see FIG. 4) which is stacked on the light emitting layered structure 3 along a stacking direction (X), the transparent electrode layer 51 having opposite first and second surfaces 511, 512; and a total-internal-reflection (TIF) suppression material 4 dispersed in the transparent electrode layer 51 and containing a secondary metal oxide 41 that is different from the primary metal oxide 513. The secondary metal oxide 41 has a concentration gradient within the transparent electrode layer 51 along the stacking direction (X). FIGS. 3 to 6 show that the concentration of the secondary metal oxide 41 may gradually increase inwardly from the first surface 511 (the concentration of the secondary metal oxide 41 is substantially zero at the first surface 511) and then gradually decrease toward the second surface 512 (the concentration of the secondary metal oxide 41 is substantially zero at the second surface 512 and the vicinity of the second surface 512). The total-internal-reflection suppression material 4 may provide function(s), such as light scattering, in the transparent electrode layer 51, and is capable of suppressing total-internal-reflection within the transparent electrode layer 51 and at an interface between the transparent electrode layer 51 and the light emitting layered structure 3.

In this embodiment, the light emitting layered structure 3 includes a buffer layer 31, first and second type semiconductor layers 32, 35, an active layer 33 disposed between the first and second type semiconductor layers 32, 35, and a current barrier layer 34 disposed between the active layer 33 and the second type semiconductor layer 35. The transparent electrode layer 51 is formed on the second type semiconductor layer 35.

The substrate 2 may be made of sapphire. The first and second type semiconductor layers 32, 35 may be made of n-type and p-type GaN, respectively. The active layer 33 may include a GaN-based multi-quantum well, such as InGaN/GaN. The current barrier layer 34 may be made of AlGaN.

The electrode unit 5 further includes a first electrode contact 52 that is formed on the transparent electrode layer 51, and a second electrode contact 53 that is formed on the first type semiconductor layer 32.

The primary metal oxide 513 may be selected from the group consisting of indium tin oxide, tin oxide, zinc oxide, indium oxide, indium zinc oxide, gallium oxide, indium gallium oxide, indium zinc gallium oxide, zinc germanium oxide, and combinations thereof.

The secondary metal oxide 41 may contain an oxide of a first metal that is selected from the group consisting of silver, gold, aluminum, platinum, titanium, zirconium, palladium, and nickel.

The total-internal-reflection suppression material 4 may further contain nano-structures 42 of the first metal and a bi-metal oxide 43 of the first metal and a second metal. The second metal may be selected from the group of indium, gallium, and germanium.

The transparent electrode layer 51 has a layer thickness that is preferably greater than 50 nm and less than 250 nm. The first surface 511 is in contact with the second type semiconductor layer 35 of the light emitting layered structure 3. The total-internal-reflection suppression material 4 may have a depth (d) (see FIG. 2) from the first surface 511 toward the second surface 512 that is less than the layer thickness of the transparent electrode layer 51. The depth (d) of the total-internal-reflection suppression material is preferably greater than 20 nm and less than 200 nm.

Figure 7A:
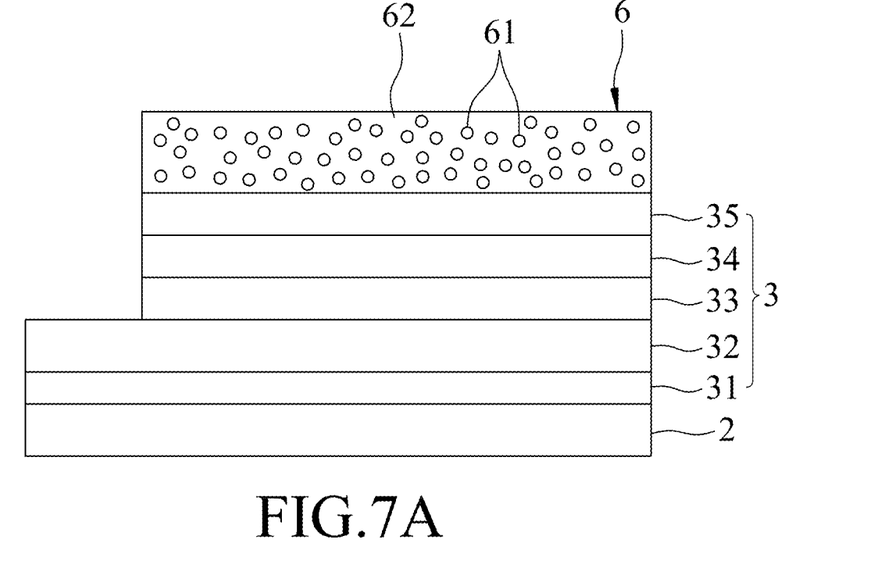
FIGS. 7A to 7D are schematic views illustrating consecutive steps of a method of making the light emitting device according to the present invention.
Figure 7B:
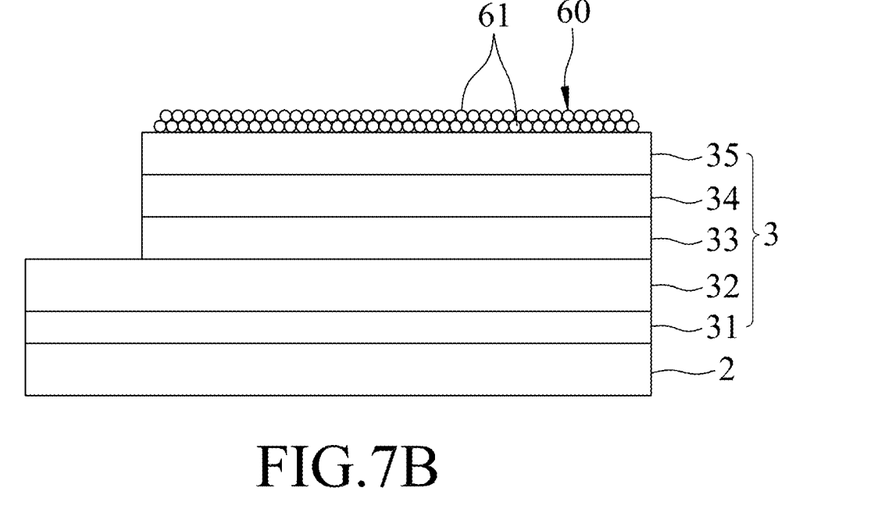
Figure 7C:
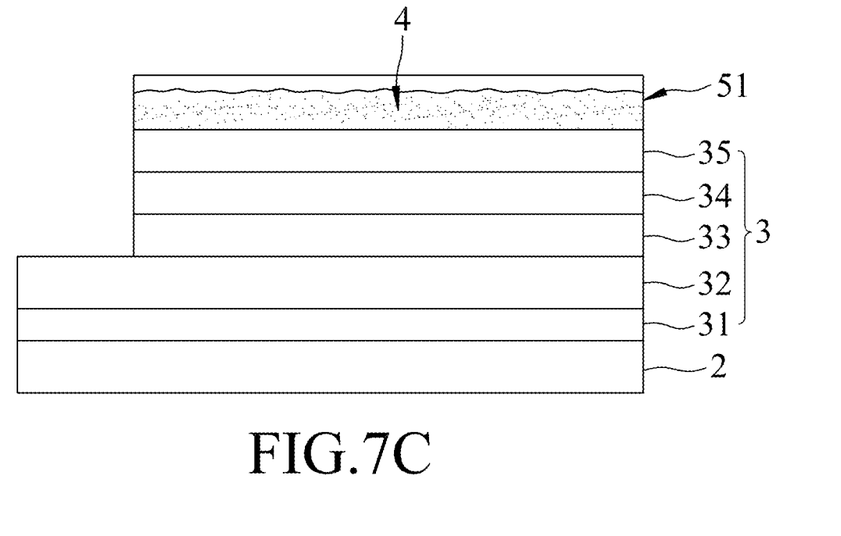
Figure 7D:
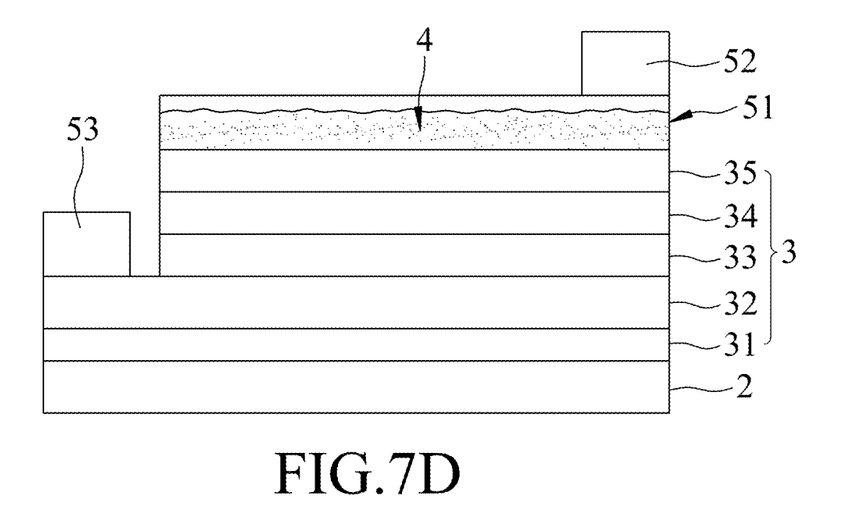

The light emitting device of the present invention may be made by a method which includes the steps of: preparing the light emitting layered structure 3 which is formed on the substrate 2; forming a coating layer 6, which contains a solvent 62 and metal nanoparticles 61 of a first metal dispersed in the solvent 62, on the light emitting layered structure 3 using spin coating techniques (see FIG. 7A); drying the coating layer 6 to form a particle layer 60 of the metal nanoparticles 61 on the light emitting layered structure 3 (see FIG. 7B); subjecting an assembly of the particle layer 60 and the light emitting layered structure 3 to an e-beam evaporation deposition process under the presence of oxygen to simultaneously form a transparent electrode layer 51 of a primary metal oxide 513 on the substrate 2 and at least partially oxidize the first metal of the metal nanoparticles 61 to form nano-structures, such that the nano-structures thus formed are dispersed in the transparent electrode layer 51 (see FIG. 7C); subjecting the transparent electrode layer 51 to an annealing process; and forming first and second electrode contacts 52, 53 on the transparent electrode layer 51 and the first type semiconductor layer 32, respectively (see FIG. 7D). In one embodiment, the first metal is silver, and the nano-structures thus formed include $Ag_2O$ phase (serving as the secondary metal oxide), $AgInO_2$ phase (serving as the bi-metal oxide), and Ag phase (unreacted first metal).

The solvent 62 used in the coating layer 6 may be isopropanone. The concentration of the metal nanoparticles 61 in the coating layer 6 may range from 5 ppm to 50 ppm. The suppression of the total internal reflection is poor when the concentration of the metal nanoparticles 61 is less than 5 ppm, while the conductivity and the transparency of the transparent electrode layer 51 are considerably reduced when the concentration of the metal nanoparticles 61 is greater than 50 ppm. Preferably, the concentration of the metal nanoparticles 61 in the coating layer 6 ranges from 5 ppm to 10 ppm. In addition, the metal nanoparticles 61 may have an average diameter greater than 20 nm and less than 100 nm.

Figure 8:
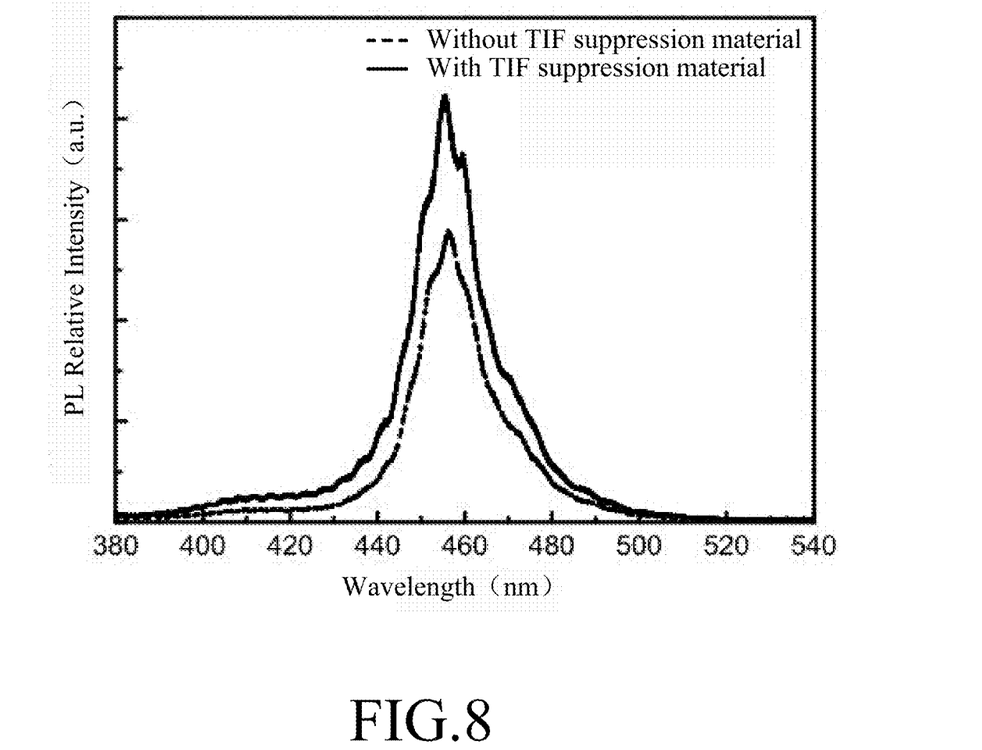
FIG. 8 is a plot of photoluminescent (PL) relative intensity versus wavelength for an example of the light emitting device of the present invention and a comparative example of a conventional light emitting device.

FIG. 8 is a plot of photoluminescence (PL) relative intensity versus wavelength for an example of the light emitting device of the present invention (with the total-internal-reflection suppression material 4 in the transparent electrode layer 51) and a comparative example of a conventional light emitting device (which is similar to the example of the light emitting device of the present invention but without the total-internal-reflection suppression material 4 in the transparent electrode layer 51). The results show that the example of the light emitting device of the present invention has a PL relative intensity higher than that of the comparative example of the conventional light emitting device over a wavelength from about 400 nm to about 500 nm. Note that the concentration of the metal nanoparticles 61 in the coating layer 6 used in the method of making the aforesaid example of the light emitting device is about 10 ppm.

Figure 9:
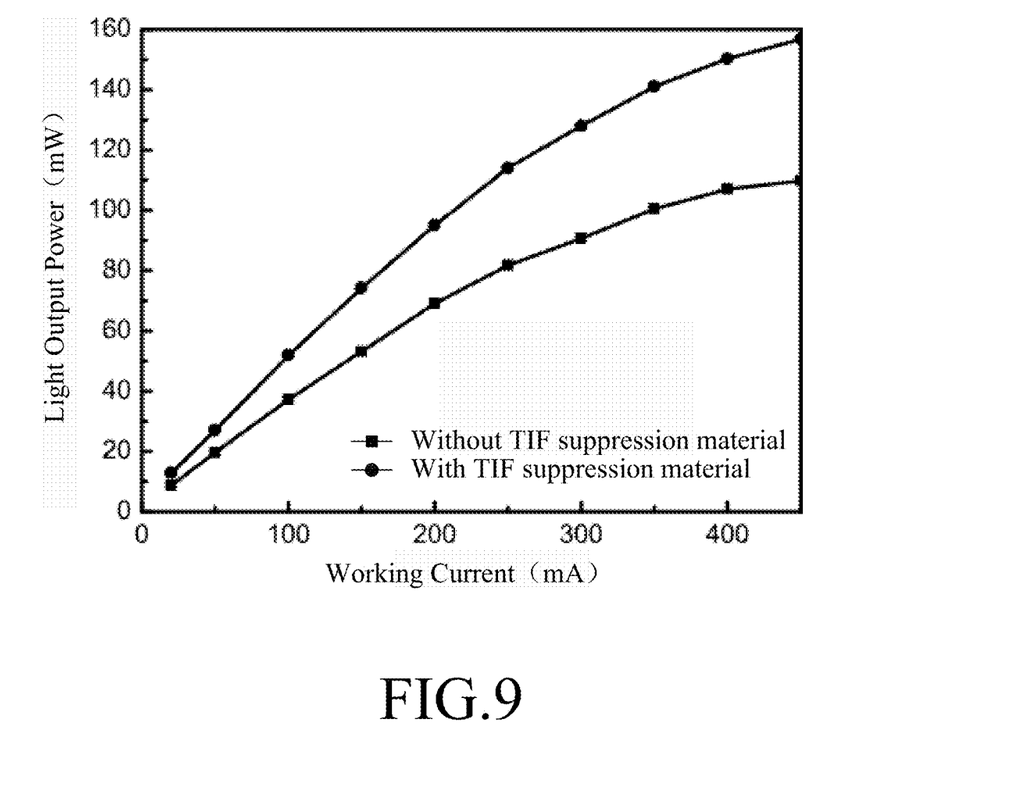
FIG. 9 is a plot of light output power versus working current for the example of the light emitting device of the present invention and the comparative example of the conventional light emitting device.

FIG. 9 is a plot of light output power versus working current for the aforesaid example of the light emitting device of the present invention and the comparative example of the conventional light emitting device. The results show that the example of the light emitting device of the present invention has a light output power much higher than that of the comparative example of the conventional light emitting device over a working current from about 20 mA to about 450 mA. For instance, the light output power is increased by about 36% (from about 110 mW to 150 mW) for the aforesaid example of the light emitting device as compared to the comparative example when the working current is operated at about 400 mA, and is increased by about 44% (from about 90 mW to 130 mW) as compared to the comparative example when the working current is operated at about 300 mA.

Figure 10:
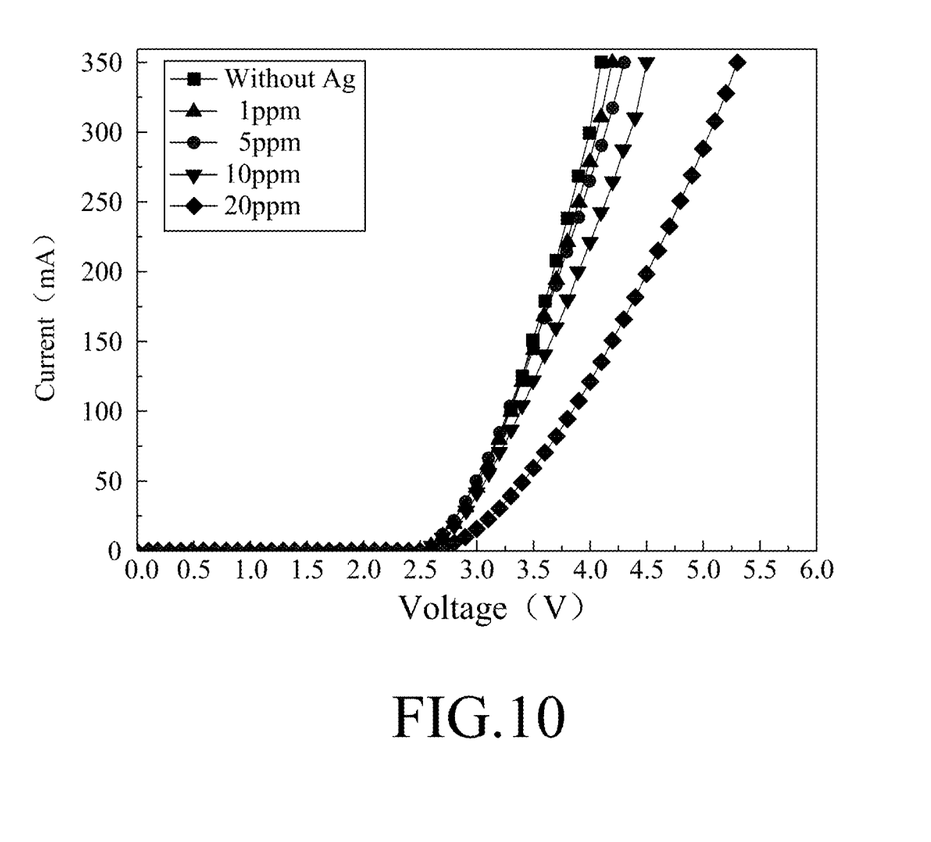
FIG. 10 is a plot of electric current versus voltage for examples of the light emitting devices of the present invention and the comparative example of the conventional light emitting device.

FIG. 10 is a plot of electric current versus voltage for examples of the light emitting devices of the present invention and the comparative example of the conventional light emitting device. The examples of the light emitting devices differ from one another in the concentration of the total-internal-reflection suppression material 4 in the transparent electrode layer 51, which depends on the concentration of the metal nanoparticles 61 in the coating layer 6 employed in the method of the present invention. The concentrations of the metal nanoparticles 61 in the coating layer 6 for forming the examples of the light emitting devices are respectively 1 ppm, 5 ppm, 10 ppm, and 20 ppm. The results show that the comparative example of the conventional light emitting device has a higher electric current under a fixed voltage than that of each of the examples of the light emitting device of the present invention, which indicates that the inclusion of the total-internal-reflection suppression material 4 in the transparent electrode layer 51 increases the resistance or decreases the conductivity of the light emitting device. The results also show that although having a lower conductivity, the light emitting devices (particularly those from examples with the concentration of the metal nanoparticles 61 in the coating layer 6 not greater than 10 ppm) can still achieve a satisfactory and competitive conductivity under a fixed voltage as compared to the conventional light emitting device.

With the inclusion of the total-internal-reflection suppression material 4 in the transparent electrode layer 51 of the light emitting device of the present invention, the aforesaid drawback with respect to the generation of the total-internal-reflection in the light emitting device may be alleviated.

While the present invention has been described in connection with what is considered the most practical embodiment, it is understood that this invention is not limited to the disclosed embodiment but is intended to cover various arrangements included within the spirit and scope of the broadest interpretation and equivalent arrangements.

What is claimed is:

1. A light emitting device with anti-total-internal-reflection capability, comprising:
    a light emitting layered structure;
    an electrode unit connected to said light emitting layered structure for providing electrical power to said light emitting layered structure, said electrode unit including a transparent electrode layer of a primary metal oxide which is stacked on said light emitting layered structure along a stacking direction; and
    a total-internal-reflection suppression material dispersed in said transparent electrode layer and containing a secondary metal oxide that is different from said primary metal oxide;
    wherein said secondary metal oxide has a concentration gradient within said transparent electrode layer along the stacking direction,
    wherein said transparent electrode layer has a first surface that is in contact with said light emitting layered structure, and a second surface that is disposed opposite to said first surface, the concentration of said secondary metal oxide being substantially zero at said first surface and gradually increasing from said first surface and then gradually decreasing toward said second surface.

2. The light emitting device of claim 1, wherein said primary metal oxide is selected from the group consisting of indium tin oxide, tin oxide, zinc oxide, indium oxide, indium zinc oxide, gallium oxide, indium gallium oxide, indium zinc gallium oxide, zinc germanium oxide, and combinations thereof.

3. The light emitting device of claim 1, wherein said secondary metal oxide contains an oxide of a first metal that is selected from the group consisting of silver, gold, aluminum, platinum, titanium, zirconium, palladium, and nickel.

4. The light emitting device of claim 3, wherein said total-internal-reflection suppression material further contains a bi-metal oxide of said first metal and a second metal, said second metal being selected from the group of indium, gallium, and germanium.

5. The light emitting device of claim 3, wherein said total-internal-reflection suppression material further contains nano-structures of said first metal.

6. The light emitting device of claim 1, wherein said transparent electrode layer has a layer thickness greater than 50 nm and less than 250 nm.

7. The light emitting device of claim 1, said total-internal-reflection suppression material penetrates into said transparent electrode layer from said first surface toward said second surface to a depth less than said layer thickness of said transparent electrode layer.

8. The light emitting device of claim 7, wherein said depth of said total-internal-reflection suppression material, which penetrates into said transparent electrode layer from said first surface toward said second surface, is greater than 20 nm and less than 200 nm.

9. The light emitting device of claim 1, wherein said light emitting layered structure includes first and second type semiconductor layers and an active layer disposed between said first and second type semiconductor layers.

10. The light emitting device of claim 9, wherein said second type semiconductor layer is made of p-GaN, said transparent electrode layer being formed on said second type semiconductor layer.

11. A method of making a light emitting device comprising:
    preparing a light emitting layered structure;
    forming a particle layer, which contains metal nanoparticles of a first metal, on the light emitting layered structure; and
    simultaneously forming a transparent electrode layer of a primary metal oxide and at least partially oxidizing the first metal to form a secondary metal oxide, such that the secondary metal oxide is dispersed in the transparent electrode layer.

12. The method of claim 11, wherein formation of the primary metal oxide and the secondary metal oxide is conducted under the presence of oxygen.

13. The method of claim 11, wherein the first metal is selected from the group consisting of silver, gold, aluminum, platinum, titanium, zirconium, palladium, and nickel.

14. The method of claim 11, wherein formation of the particle layer is conducted by forming a coating layer containing a solvent and the metal nanoparticles on a surface of the light emitting layered structure, followed by drying.

15. The method of claim 14, wherein the metal nanoparticles have an average diameter greater than 20 nm and less than 100 nm.

16. The method of claim 14, wherein the concentration of the metal nanoparticles in the coating layer ranges from 5 ppm to 50 ppm.

* * * * *